United States Patent
Receveur et al.

(10) Patent No.: US 7,688,166 B2
(45) Date of Patent: Mar. 30, 2010

(54) MULTI-STABLE MICRO ELECTROMECHANICAL SWITCHES AND METHODS OF FABRICATING SAME

(75) Inventors: Rogier Receveur, Maastricht (NL); Philippe Habets, Maastricht (NL); Ralph B. Danzl, Tempe, AZ (US); Richard P. M. Houben, Lanaken (BE); Michael F. Mattes, Chandler, AZ (US)

(73) Assignee: Medtronic, Inc., Minneapolis, MN (US)

( * ) Notice: Subject to any disclaimer, the term of this patent is extended or adjusted under 35 U.S.C. 154(b) by 468 days.

(21) Appl. No.: 11/532,689

(22) Filed: Sep. 18, 2006

(65) Prior Publication Data

US 2007/0009203 A1 Jan. 11, 2007

Related U.S. Application Data

(62) Division of application No. 10/425,861, filed on Apr. 29, 2003, now Pat. No. 7,190,245.

(51) Int. Cl.
*H01H 51/22* (2006.01)
(52) U.S. Cl. .................................. 335/78; 200/181
(58) Field of Classification Search ............ 335/78; 200/181
See application file for complete search history.

(56) References Cited

U.S. PATENT DOCUMENTS

| | | | |
|---|---|---|---|
| 1,768,385 A | 6/1930 | Walle | |
| 4,316,472 A | 2/1982 | Mirowski et al. | |
| 4,375,817 A | 3/1983 | Engle et al. | |
| 4,384,585 A | 5/1983 | Zipes | |
| 4,476,868 A | 10/1984 | Thompson | |
| 4,566,063 A | 1/1986 | Zolnowsky et al. | |
| 4,570,139 A * | 2/1986 | Kroll | 335/187 |

(Continued)

FOREIGN PATENT DOCUMENTS

DE 1166894 4/1964

(Continued)

OTHER PUBLICATIONS

Wang Y. et al., "A Micromachined RF Microrelay with Electrothermal Actuation," Sensors and Actuators A, vol. 103, pp. 231-236 ,(2003).

(Continued)

*Primary Examiner*—Elvin G Enad
*Assistant Examiner*—Bernard Rojas
(74) *Attorney, Agent, or Firm*—Michael C. Soldner; Stephen W. Bauer

(57) ABSTRACT

A micro electromechanical (MEMS) switch suitable for use in medical devices is provided, along with methods of producing and using MEMS switches. In one aspect, a micro electromechanical switch including a moveable member configured to electrically cooperate with a receiving terminal is formed on a substrate. The moveable member and the receiving terminal each include an insulating layer proximate to the substrate and a conducting layer proximate to the insulating layer opposite the substrate. In various embodiments, the conducting layers of the moveable member and/or receiving terminal include a protruding region that extends outward from the substrate to switchably couple the conducting layers of the moveable member and the receiving terminal to thereby form a switch. The switch may be actuated using, for example, electrostatic energy.

15 Claims, 5 Drawing Sheets

U.S. PATENT DOCUMENTS

| | | |
|---|---|---|
| 4,577,633 A | 3/1986 | Berkovits et al. |
| 4,587,970 A | 5/1986 | Holley et al. |
| 4,726,380 A | 2/1988 | Vollmann et al. |
| 4,727,877 A | 3/1988 | Kallok |
| 4,800,883 A | 1/1989 | Winstrom |
| 4,821,733 A | 4/1989 | Peck |
| 4,830,006 A | 5/1989 | Haluska et al. |
| 4,880,005 A | 11/1989 | Pless et al. |
| 4,949,719 A | 8/1990 | Pless et al. |
| 4,953,551 A | 9/1990 | Mehra et al. |
| 5,025,346 A | 6/1991 | Tang et al. |
| 5,072,288 A | 12/1991 | MacDonald et al. |
| 5,099,838 A | 3/1992 | Bardy |
| 5,117,824 A | 6/1992 | Keimel et al. |
| 5,131,388 A | 7/1992 | Pless et al. |
| 5,144,949 A | 9/1992 | Olson |
| 5,158,078 A | 10/1992 | Bennett et al. |
| 5,163,427 A | 11/1992 | Keimel |
| 5,188,105 A | 2/1993 | Keimel |
| 5,199,428 A | 4/1993 | Obel et al. |
| 5,207,218 A | 5/1993 | Carpentier et al. |
| 5,269,298 A | 12/1993 | Adams et al. |
| 5,312,453 A | 5/1994 | Shelton et al. |
| 5,314,430 A | 5/1994 | Bardy |
| 5,330,507 A | 7/1994 | Schwartz |
| 5,331,966 A | 7/1994 | Bennett et al. |
| 5,354,316 A | 10/1994 | Keimel |
| 5,415,043 A | 5/1995 | Zabler et al. |
| 5,545,186 A | 8/1996 | Olson et al. |
| 5,662,692 A | 9/1997 | Paspa et al. |
| 5,690,686 A | 11/1997 | Min et al. |
| 5,797,970 A | 8/1998 | Pouvreau |
| 5,800,465 A | 9/1998 | Thompson et al. |
| 5,914,553 A | 6/1999 | Adams et al. |
| 5,966,066 A * | 10/1999 | Mehregany et al. ........... 337/70 |
| 6,020,564 A | 2/2000 | Wang et al. |
| 6,114,794 A | 9/2000 | Dhuler et al. |
| 6,137,206 A | 10/2000 | Hill |
| 6,144,545 A | 11/2000 | Lee et al. |
| 6,153,839 A | 11/2000 | Zavracky et al. |
| 6,191,671 B1 | 2/2001 | Schlaak et al. |
| 6,218,911 B1 | 4/2001 | Kong et al. |
| 6,303,885 B1 | 10/2001 | Hichwa et al. |
| 6,307,169 B1 | 10/2001 | Sun et al. |
| 6,388,359 B1 | 5/2002 | Duelli et al. |
| 6,531,668 B1 | 3/2003 | Ma |
| 6,635,837 B2 | 10/2003 | Subramanian et al. |
| 6,686,820 B1 | 2/2004 | Ma et al. |
| 6,734,770 B2 | 5/2004 | Aigner et al. |
| 6,800,912 B2 | 10/2004 | Ozgur |
| 6,804,552 B2 | 10/2004 | Thompson et al. |
| 7,053,737 B2 * | 5/2006 | Schwartz et al. .............. 335/78 |
| 2003/0132824 A1 | 7/2003 | Ma |
| 2004/0008097 A1 | 1/2004 | Ma et al. |
| 2004/0050675 A1 | 3/2004 | Feng et al. |
| 2004/0056740 A1 | 3/2004 | Ma et al. |

FOREIGN PATENT DOCUMENTS

| | | |
|---|---|---|
| JP | 09-251834 | 9/1997 |
| JP | 11-260178 | 9/1999 |
| JP | 2000-208018 | 7/2000 |
| JP | 3224391 | 8/2001 |
| WO | 0106543 A2 | 1/2001 |
| WO | 2004013898 A2 | 2/2004 |

OTHER PUBLICATIONS

Roy S. et al., "Design, Fabrication and Characterization of Electrostatic Microrelays", Proceedings of the SPIE, vol. 2642, Jan. 1, 1995, pp. 64-73.

Translated Office Action issued for Japanese Patent Application 2006-510109, date issued is unknown; 4 pgs.

* cited by examiner

MULTI-STABLE MICRO ELECTROMECHANICAL SWITCHES AND METHODS OF FABRICATING SAME

CROSS-REFERENCE TO RELATED APPLICATION

This is a divisional application of and claims priority to U.S. Ser. No. 10/425,861 filed Apr. 29, 2003, now U.S. Pat. No. 7,190,245 entitled "Multi-Stable Micro Electromechanical Switches and Methods of Fabricating Same", incorporated herein by reference in its entirety.

TECHNICAL FIELD

The present invention generally relates to electromechanical switches, and more particularly relates to micro electromechanical switches that have multiple stable states.

BACKGROUND

Switches are commonly found in most modern electrical and electronic devices to selectively place electrical, optical and/or other signals onto desired signal paths. Switches may be used to enable or disable certain components or circuits operating within a system, for example, or may be used to route communications signals from a sender to a receiver. Electromechanical switches in particular are often found in medical, industrial, aerospace, consumer electronics and other settings.

In recent years, advances in micro electromechanical systems (MEMS) and other technologies have enabled new generations of electromechanical switches that are extremely small (e.g. on the order of micrometers, or $10^{-6}$ meters) in size. Because many micro switches can be fabricated on a single wafer or substrate, elaborate switching circuits may be constructed within a relatively small physical space. Although it would generally be desirable to include such tiny electromagnetic switches in medical devices (e.g. pacemakers, defibrillators, etc.) and other applications, several disadvantages have prevented widespread use in many products and environments. Most notably, many conventional micro electromechanical switches consume too much power for practical use in demanding environments, such as in a device that is implanted within a human body. Moreover, difficulties often arise in isolating the switch actuation signal from the transmitted signal in such environments. Further, the amount of energy (e.g. electrical voltage) typically required to actuate a conventional electromechanical switch may be too great for many practical applications, particularly in the medical field.

Accordingly, it is desirable to create a micro electromechanical switch that consumes a relatively low amount of power, and that can be actuated with a relatively small amount of energy. It is also desirable to create an electromechanical switch that improves electrical isolation between switch actuation signals and signals routed by the switch. In addition, it is desirable to create a micro electromechanical switch that is easily manufactured, and that is suitable for use in demanding medical device applications and the like. Furthermore, other desirable features and characteristics of the present invention will become apparent from the subsequent detailed description and the appended claims, taken in conjunction with the accompanying drawings and the foregoing technical field and background.

BRIEF SUMMARY

In one aspect, a micro electromechanical switch including a moveable member configured to electrically cooperate with a receiving terminal is formed on a substrate. The moveable member and the receiving terminal each include an insulating layer proximate to the substrate and a conducting layer proximate to the insulating layer opposite the substrate. In various embodiments, the conducting layers of the moveable member and/or receiving terminal include a protruding region that extends outward from the substrate to switchably couple the conducting layers of the moveable member and the receiving terminal to thereby form a switch. The switch may be actuated using, for example, electrostatic energy.

In a further aspect, a multi-stable electromechanical switch having an open state and a closed state suitably includes a moveable member and at least one pair of receiving terminals biased to a bias position corresponding to the open state. Each terminal suitably has an outcropping configured to interface with the moveable member in the closed state. An actuating circuit provides electrostatic energy to displace the receiving terminals from the bias position, and to displace the moveable member toward the bias position. The receiving terminals then return toward the bias position when the electrostatic energy is removed to establish an electrical connection with the moveable member, thereby retaining the electromechanical switch in the closed state.

The various electromechanical switches described herein may be useful in a wide variety of applications, including many applications in the medical device field. Such switches may be useful in producing Y-adapter-type lead multiplexers for implantable devices, for example, as well as in producing switchable electrostimulation electrode arrays and the like.

BRIEF DESCRIPTION OF THE DRAWING FIGURES

The present invention will hereinafter be described in conjunction with the following drawing figures, wherein like numerals denote like elements, and FIGS. 1A-B are cross-sectional side views of exemplary opposing contact members of an exemplary switch;

FIGS. 2A-D are cross-sectional side views illustrating an exemplary process for producing exemplary contact members;

Figure 5A:
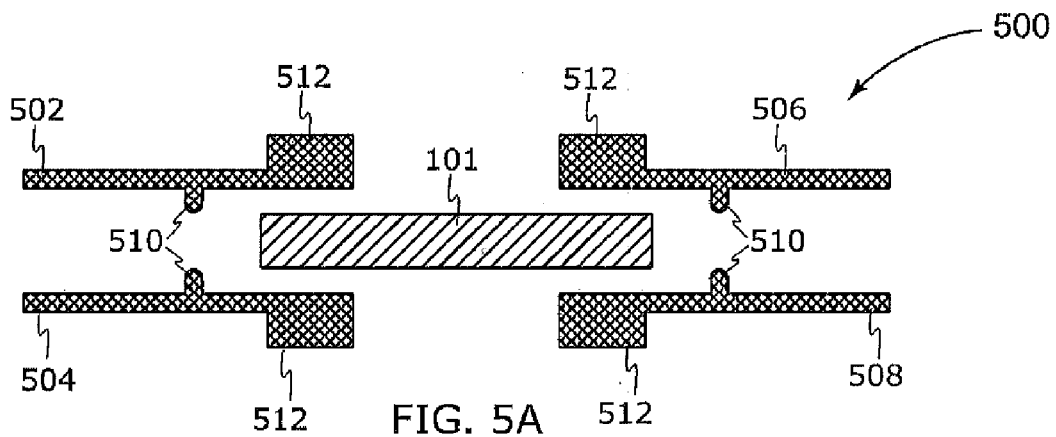
Figure 5B:
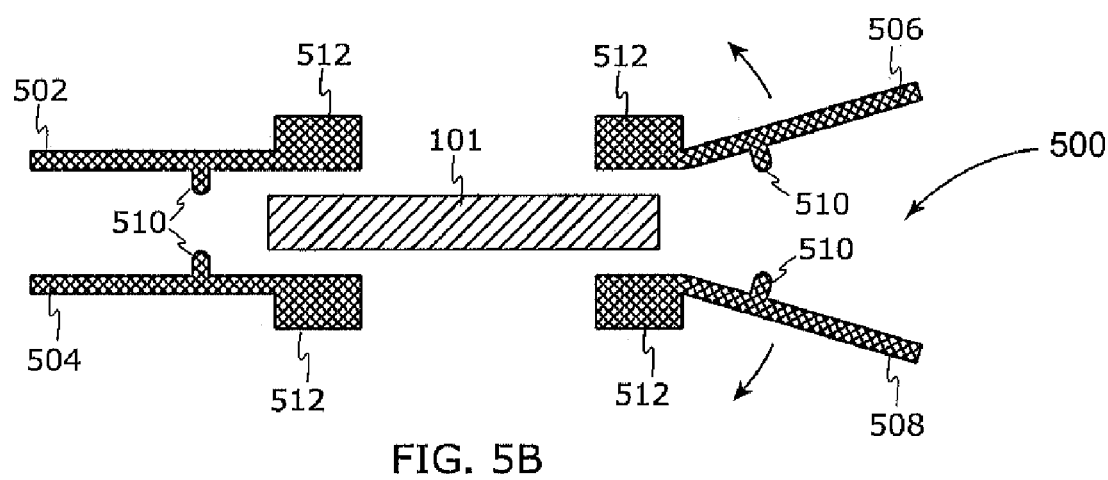
Figure 5C:
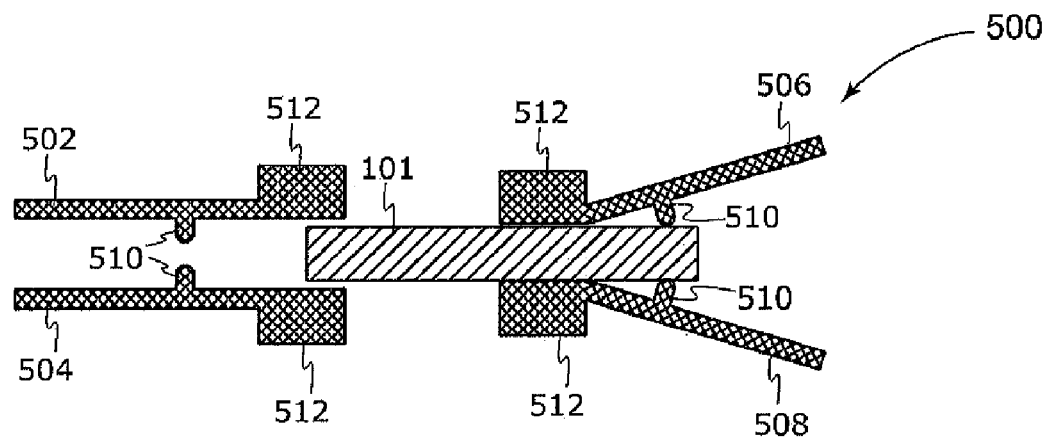
Figure 6:
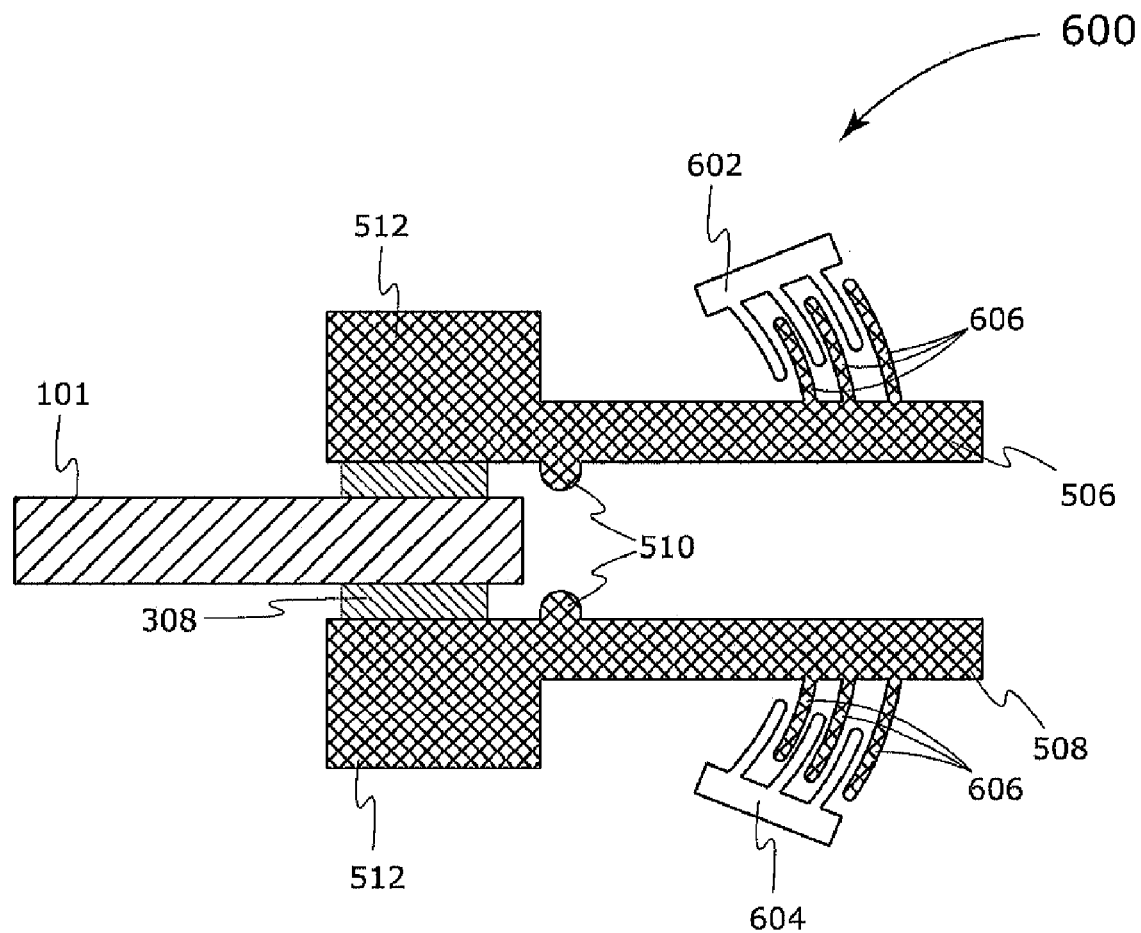

FIGS. 5A-C are top views of an exemplary tri-stable micro electromechanical switch; and FIG. 6 is a top view of an exemplary bi-stable micro electromechanical switch with an exemplary actuating circuit.

DETAILED DESCRIPTION

The following detailed description is merely exemplary in nature and is not intended to limit the invention or the application and uses of the invention. Furthermore, there is no intention to be bound by any expressed or implied theory presented in the preceding technical field, background, brief summary or the following detailed description.

According to various exemplary embodiments, switches suitable for use in medical devices and the like are fabricated using conventional MEMS techniques. The switches suitably include a moveable armature, cantilever or other member that is capable of selectively engaging one or more receiving terminals to place the switch into a desired state. In various embodiments, the moveable member and/or receiving terminal(s) are fashioned with a protruding region formed of a noble metal (e.g. gold) or another conductive material to improve electrical connections within the switch. In further embodiments, the switch is configured to exhibit two or more stable output states without consuming energy to maintain the switch in a desired state. Stability is provided by mechanically biasing one or more receiving terminals to a position corresponding to a first state of the switch (e.g. an open state corresponding to an open circuit), and by positioning the moveable member into the bias position when the switch is in another state (e.g. corresponding to a closed switch). In such embodiments the mechanical bias of the receiving terminals maintains contact with the moveable member even when the energy used to displace switch components is removed. Accordingly, the switch remains in the desired state without requiring continuous application of energy, thereby conserving power. The various switches described herein may be used in a wide variety of applications, including applications in the medical, industrial, aerospace, consumer electronic or other arts. Several applications in the medical field include switchable Y-adapter lead multiplexers for implantable medical devices, switchable electrode arrays, and the like.

Figure 1A:
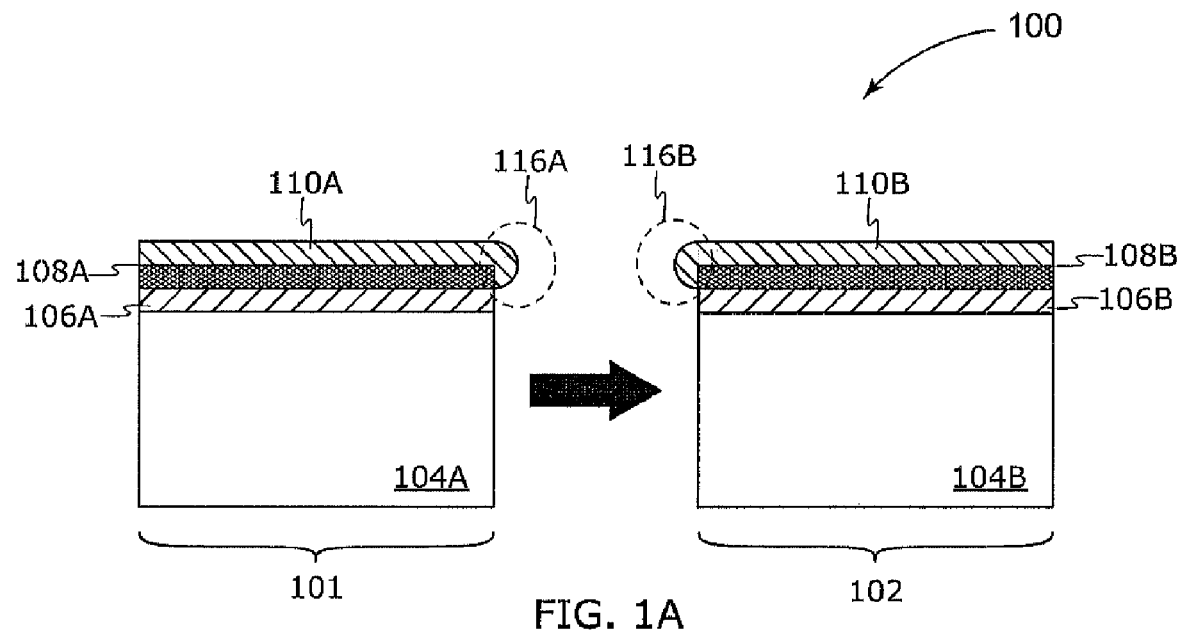

With reference now to FIG. 1A, an exemplary electromechanical switch suitably includes a moveable member 101 that electrically contacts with one or more receiving terminals 102 to complete an electrical circuit, and to thereby place switch 100 into a desired output state (e.g. open or closed). Moveable member 101 and any associated terminals 102 are collectively referred to herein as "contact members". Moveable member 101 is suitably formed from a substrate layer 104A, an insulating layer 106A, a conducting layer 108A, and a conductive coating 110A that appropriately surrounds conducting layer 108A to form a protruding region 116A that extends radially outward from substrate 104A, and that provides an appropriate electrical contact to receiving terminal 102. Similarly, terminal 102 is suitably formed from a substrate layer 104B, an insulating layer 106B, a conducting layer 108B, and a conductive coating 110B. Conductive coating 110B may also be formed to create a protruding region 116B extending outward from receiving terminal 102 to interface with protruding region 116A of moveable member 101 and to thereby form an electrical connection to close switch 100. Although both moveable member 101 and terminal 102 are both shown in FIG. 1A with protruding regions 116, the protruding portion may be removed from either of the contact members in various alternate embodiments.

Figure 1B:
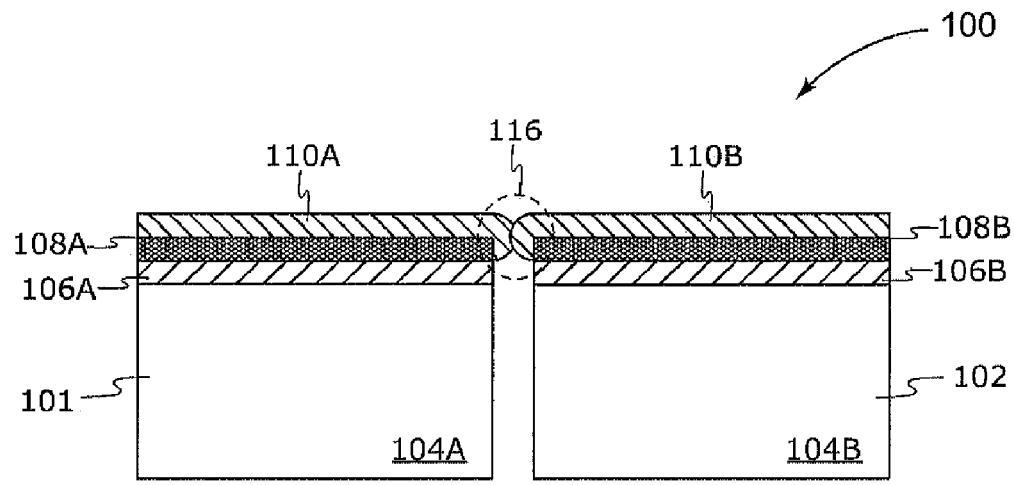

In operation, moveable member 101 is capable of lateral movement to switchably engage receiving terminal 102. FIG. 1B shows an exemplary switch 100 wherein moveable member 101 is in contact with terminal 102 to thereby complete an electrical circuit and to place switch 100 into a "closed" state. Because protruding regions 116 extend outward from substrate 104, protruding regions 116 appropriately form an electrical connection without requiring contact between substrate layers 104A-B and/or insulating layers 106A-B. This separation between the non-conducting layers of moveable member 101 and terminal 102 provides an electrical isolation between the two members, which in turn assists in isolating actuation signals propagating in switch 100 from signals transmitted by switch 100, as described more fully below.

Figure 2A:
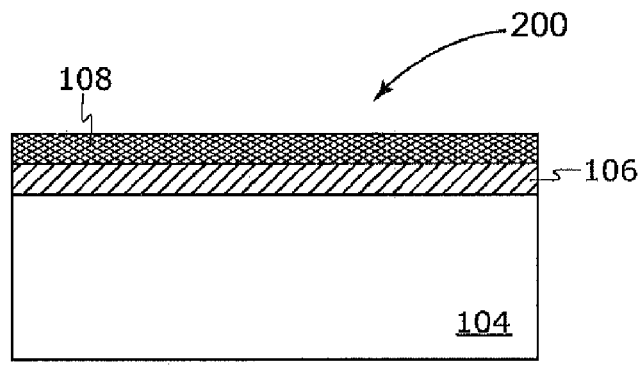
Figure 2B:
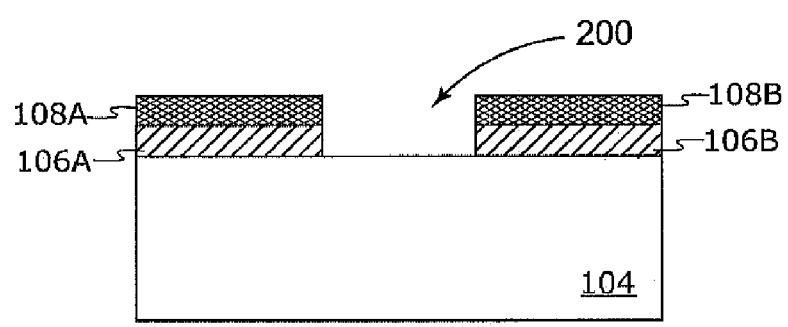
Figure 2C:
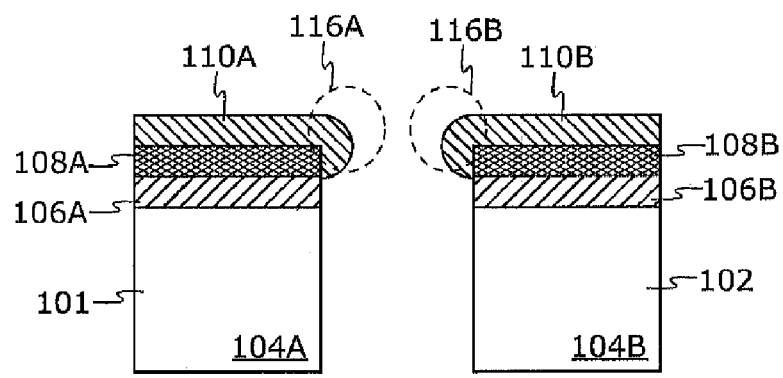
Figure 2D:
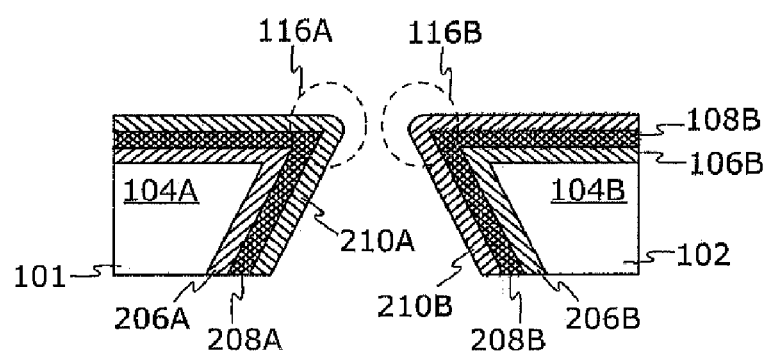

Referring now to FIGS. 2A-2D, an exemplary process for building a switch 100 suitably includes the broad steps of forming insulating and conducting layers on a substrate (FIG. 2A), isolating the moveable members and terminals (FIG. 2B), applying a conductive coating to the appropriate portions of the switch (FIG. 2C), and optionally etching or otherwise processing a backside of the substrate to further define terminals, moveable members and the like (FIG. 2D). The various steps described in the figures may be implemented using any manufacturing or fabrication techniques, such as those conventionally used for MEMS and/or integrated circuit technologies. Various switch fabrication techniques are described, for example, in U.S. Pat. No. 6,303,885.

With reference to FIG. 2A, the switch fabrication process suitably begins by preparing a substrate assembly 200 that includes a substrate 104, an insulating layer 106 and a conducting layer. Substrate 104 is any material such as glass, plastic, silicon or the like that is capable of supporting one or more switches 100. In an exemplary embodiment, substrate 104 is formed from doped silicon, and has a thickness on the order of 35-75' m, although the actual dimensions will vary widely from embodiment to embodiment. Similarly, the optional dopants provided in substrate 104 may be selected to improve the connectivity of the switch, and will also vary widely with various embodiments. Substrate 104 may be prepared in any manner, and in an exemplary embodiment is prepared using conventional Silicon-on-Insulator (SOI) techniques. Insulating layer 106 may be formed of any electrically insulating material such as glass, silicon oxide, or the like, and may be placed on or near an exposed surface of substrate 104 using any technique such as sputtering, deposition or the like. Similarly, conducting layer 108 may be any metal such as aluminum, copper, gold or silver, and may be placed according to any technique. In an exemplary embodiment, insulating layer 106 and conducting layer 108 are deposited on substrate 104 using conventional liquid-phase epitaxy and/or low pressure chemical vapor deposition techniques, as appropriate.

With reference to FIG. 2B, the various electrically conducting and insulating regions of switch 100 may be suitably isolated in substrate assembly 200. Conducting layer 108 may be patterned or otherwise processed using conventional etching, lithography or other techniques, for example, to create gaps 201 between separate electrical nodes. Patterning appropriately delineates moveable members 101, actuating circuitry, receiving terminals 102 and the like from each other. An exemplary pattern for a switch 100 is discussed below in conjunction with FIG. 3. In alternate embodiments, conducting layer 108 may be eliminated entirely, with conducting and/or insulating regions on substrate assembly 200 provided by selective doping of substrate 104, as described more fully below.

Referring now to FIG. 2C, an additional conducting layer 110 of gold or another appropriate material may be grown, electroplated or otherwise formed on conducting layer 108. In one embodiment, substrate assembly 200 is further formed with an additional non-conducting layer of oxide or the like that is applied after etching or patterning. Electroless gold or another conductor can then be "grown" or otherwise applied on portions of substrate assembly that are unprotected by the additional non-conducting layer. Alternatively, conductive material can be evaporated or sputtered selectively on conductive areas using a shadow mask or the like. In yet another embodiment, gold or another conductive material is suitably electroplated, as described in conjunction with FIG. 3 below. In such embodiments conducting layer 108 may not be present, with silicon dioxide or another insulator providing electrical insulation between parts of switch 100 used for electrostatic actuation and parts used for signal conduction. In various embodiments, protruding region 116 is formed of conductive material as appropriate to engage other contact members while maintaining electrical isolation between substrate portions 104. Protruding regions 116 may be formed as a consequence of the additional exposed surface near the corners of conducting layer 108, for example, or by any other technique.

In a further embodiment, the various components of switch 100 may be physically separated from each other using conventional MEMS techniques. An anisotropic etchant such as Tetra-Methyl Ammonium Hydrate (TMAH) or Potassium Hydroxide (KOH), for example, may be used to separate moveable member 101 from terminal 102 as appropriate. In further embodiments (and as shown in FIG. 2D), additional insulating layers 206A,B and/or conducting layers 208A,B may be formed after separation but before formation of the outer conducting layer 110 to improve coverage by layer 110/210A-B. Such layers may be formed following additional etching or processing from the front or back side of substrate 104, as appropriate. Accordingly, the various contact members and other components of switch 100 may take any shape or form in a wide variety of alternate but equivalent embodiments.

Figure 3:
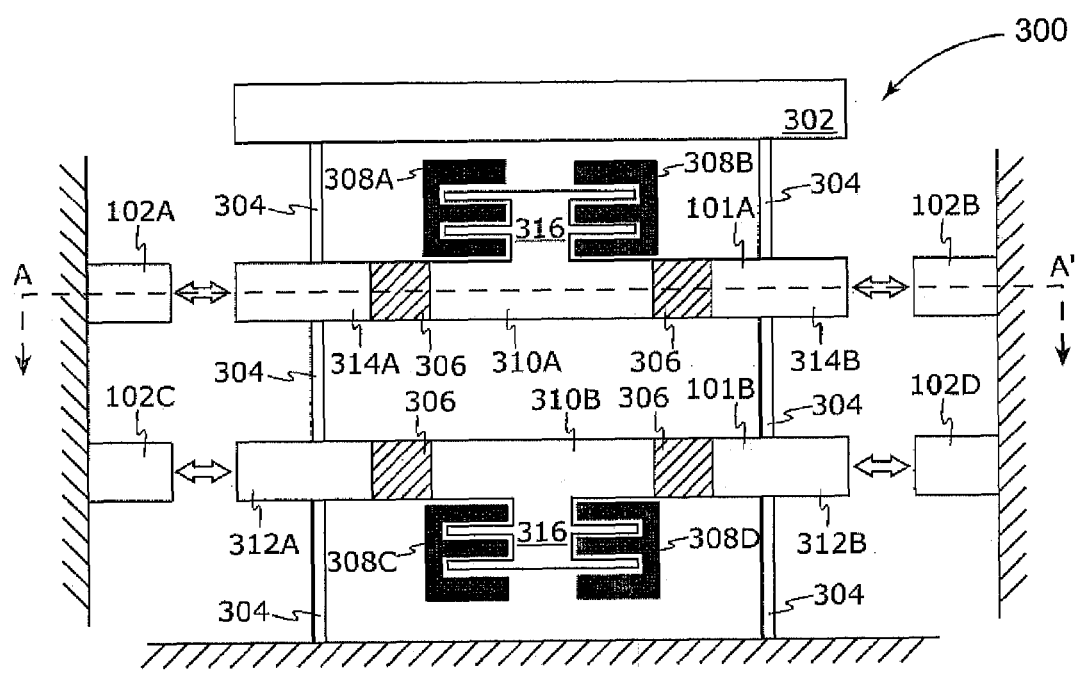
FIG. 3 is a top view of an exemplary electromechanical switch.
Figure 4:
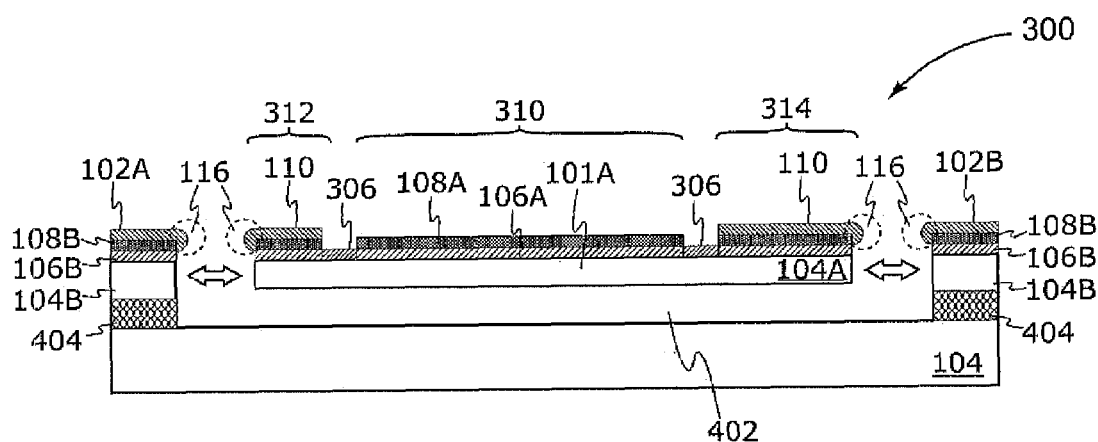
FIG. 4 is a side view of an exemplary electromechanical switch.

FIGS. 3 and 4 are top and side views, respectively, of an exemplary switch assembly 300, with FIG. 4 being a cross-sectional side view taken along line A-A' in FIG. 3. Referring now to FIG. 3, an exemplary switch assembly 300 suitably includes one or more cantilevers or other moveable members 101A-B that are capable of interacting with any number of receiving terminals 102A-D, as appropriate. In the exemplary switch assembly 300 shown in FIG. 3, two tri-stable switches corresponding to moveable members 101A and 101B are shown. One switch, for example, has a first state corresponding to contact between moveable member 101A and terminal 102A, a second state corresponding to contact between moveable member 101A and terminal 102B, and a third state corresponding to no contact between moveable member 101A and either terminal. Similarly, the other switch shown has a first state corresponding to contact between moveable member 101B and terminal 102C, a second state corresponding to contact between moveable member 101B and terminal 102D, and a third state corresponding to no contact between moveable member 101B and either terminal. Accordingly, each of the two switches are capable of three separate output states. Alternate embodiments of switch fabric 300 may include any number of moveable members 101 and/or terminals 102. Similarly, each switch may have any number of available output states such as two, three or more.

Each moveable member 101 and terminal 102 may be formed from a common substrate 104 as described above, with one or more hinges 304 providing flexible mechanical support for each moveable member 101. Each moveable member 101A-B suitably includes two conducting regions 312 and 314 that are capable of electrically interfacing with terminals 102A-D as described above. In the exemplary embodiment shown in FIG. 3, member 101A has a first conducting region 314A that interfaces with terminal 102A and a second conducting region 314B that interfaces with terminal 102B. Similarly, member 101B has a first conducting region 312A that interfaces with terminal 102C and a second conducting region 312B that interfaces with terminal 102D.

Each moveable member 101 may also include another conducting region 310 that may be used to actuate the member 101 between the various states of switch 300. In the exemplary embodiment shown in FIG. 3, for example, each conducting region 310 is integrally formed with a comb-type portion 316 that is sensitive to electrostatic energy or other stimulus provided by actuators 308A-D. In the exemplary embodiment shown in FIG. 3, each portion 316 includes a series of comb-like teeth that include metal, permalloy or other material capable of being actuated by one or more actuators 308A-D. In practice, each moveable member 101 may include multiple portions 316 that are sensitive to electrostatic force, and portions 316 may take any shape and/or may be located at any point on or near moveable member 101. Although not shown in FIG. 3 for purposes of simplicity, in practice each member 101 may include two or more portions 316 on opposing sides of conducting region 310, for example, to increase the response to applied electrostatic force and to thereby more easily actuate the member between the various states of switch 300.

In practice, each moveable member 101 is displaced by one or more actuating circuits 308A-D as appropriate. In the exemplary embodiment shown in FIG. 3, for example, moveable member is suitably displaced toward terminal 102A by providing an electrostatic charge on actuator 308A that attracts comb portion 316. Similarly, an electrostatic charge provided by actuator 308B appropriately attracts comb portion 316 toward terminal 102B. Providing an electrostatic charge to both actuators 308A-B appropriately attracts comb portion 316 to the central location such that member 101A is electrically separated from each terminal 102A and 102B to place the switch into an open circuit-type state. Similar logic could be applied to member 101B, which is appropriately displaced between the three states by actuators 308C and 308D. In alternate embodiments, electrostatic attraction could be replaced or supplemented with electrostatic repulsion, RF signals, inductance of electromagnetic signals, or any other actuating force.

As briefly mentioned above, the various conducting regions 310, 312 and 314 are appropriately isolated from each other by electrically insulating portions 306, which may be exposed portions of insulating layer 106 discussed above, or which may be made up of an additionally-applied insulating material. Alternatively, insulating portions 306 (as well as some or all of the conducting portions on switch assembly 300) may be formed by injecting or otherwise placing dopant materials in the appropriate regions of substrate 104. In practice, hinges 304 and conducting regions 312 and 314 may be laid out on substrate 104 (FIGS. 1 and 4) in a pattern that allows for convenient electroplating. In such embodiments, an electrical charge applied at contact 302 has electrical continuity through conducting layer 108 (FIGS. 1-2) across each hinge 304 and conducting region 312 and 314. When such a charge is applied, outer conducting layer 110 can be readily electroplated to the desired locations on switch 300, as appropriate. Insulating regions 306 suitably provide electrical isolation for those parts of switch 300 that are not desired to become electroplated, thereby improving the manufacturability of switch 300. Electroplating may also provide appropriate protruding regions 116 as described above, and as best seen in FIG. 4.

Electroplating hinges 304 also provides mechanical reinforcement for supporting moveable members 101, which are appropriately otherwise isolated from substrate 104 to promote ease of movement. With reference now to FIG. 4, member 101A is suitably separated from substrate 104 by a gap 402 to permit lateral movement toward terminals 102A and 102B as appropriate. Gap 402 may be formed through conventional MEMS techniques, including backside etching or the like. Alternatively, substrate 104 may be formed with a sacrificial layer 404 that can be etched using conventional front side etching or otherwise removed to form gap 402. In such embodiments, sacrificial layer 402 may be formed of an oxide (e.g. silicon oxide) or another material that may be etched through cavities formed in layers 106, 108 and/or 110 as appropriate.

With reference now to FIGS. 5A-C, switch 500 is appropriately held in a number of stable output states through the use of mechanical energy applied by one or more receiving terminals. Switch 500 suitably includes at least one moveable member 101 that is displaceable to interface with one or more terminal arms 502, 504, 506, 508. Each terminal arm 502, 504, 506, 508 is appropriately designed to be moveable, rotatable, deformable or otherwise displaceable to place switch 500 into different output states. In an exemplary embodiment, each arm 502, 504, 506, 508 is designed to bend in an elastic-type fashion about a fixed point 512. Such deformabililty or elasticity may be provided by conventional MEMS or other techniques. In various embodiments, one or more terminal arms are designed to include an outcropping 510 that is able to electrically communicate with moveable member 101. In the embodiment shown in FIGS. 5A-C, terminal arms 502 and 504 cooperate to provide an electrical connection with moveable member 101 when the switch is in a first state, and terminal arms 505 and 508 cooperate to provide an electrical connection with moveable member 101 when the switch is in a second state, as shown in FIG. 5C. A third state may be provided when moveable member 101 is electrically isolated from both sets of terminal arms, as shown in FIG. 5A. The layout and structural components of switch 500 appropriately corresponds to those of switches 100, 300 and the like discussed above, or the concepts described with respect to switch 500 may be applied to any type of switch or switch architecture in a wide array of equivalent embodiments. Various equivalent embodiments of switch 500 include any number of moveable members 101, terminal arms, terminals, or output states for each moveable member 101. Although not visible in FIG. 5, each outcropping 510 or any other portion of terminal arms 502, 504, 506 and/or 508 may include a protruding region 116 as discussed above to further improve electrical connectivity between the terminal arm and moveable member 101.

Referring to FIG. 5A, switch 500 is shown in an exemplary "open" state (corresponding to an open circuit) whereby moveable member 101 is not electrically coupled to either set of terminal arms. Terminal arms 502, 504, 506 and 508 are appropriately designed such that their natural "biased" state corresponds to the open state wherein the arms are isolated from moveable member 101. As used herein, "biased state" refers to the physical space occupied by one or more terminal arms 502, 504, 506, 508 when no actuation force or energy is applied and when no other object blocks or prevents natural movement of the terminal arm.

In operation, switch 500 is placed into a different state when moveable member 101 is moved into the bias position of one or more terminal arms such that the mechanical force applied by the terminal arm in attempting to return to the bias state holds the terminal arm in contact with moveable member 101. In an exemplary embodiment, this movement involves moving the terminal arms out of the bias position, moving the moveable member into the space occupied by the terminal arms in the bias position, and then releasing the terminal arms to create mechanical and electrical contact between the arms and moveable member 101. With reference now to FIG. 5B, terminal arms 506 and 508 are appropriately actuated to move outcroppings 510 out of the way so that moveable member 101 may be displaced as appropriate. Although this movement is shown in FIG. 5B as a rotation about a fixed pivot point 512 on terminal arms 506, 508, alternate embodiments may make use of lateral displacement in vertical and/or horizontal directions, or any other type of movement.

After the terminal arms are moved out of the bias position, moveable member 101 is appropriately actuated to place at least some portion of member 101 into the space occupied by at least some portion of terminal arms 506, 508 in the bias position. This actuation may be provided with electrostatic force as described above and below, or with any other conventional actuation techniques. In the embodiment shown in FIGS. 5A-C, moveable member 101 is laterally displaced using electrostatic force or the like so that a portion of moveable member 101 occupies space corresponding to the bias positions of outcroppings 510 of terminal arms 506, 508.

As actuating force is removed from terminal arms 506 and 508, potential energy stored in the arms is converted to kinetic energy to thereby produce a torque that attempts to return arms 506, 508 to their bias positions. Because the bias position is now occupied by moveable member 101, however, arms 506 and 508 impact upon member 101 and are suitably prevented from further movement. Because potential energy remains in the arms until they are placed in the bias position, a mechanical force is provided that maintains arms 506, 508 against moveable member 101 to thereby hold switch 500 in the closed state (corresponding to a closed circuit). Accordingly, switch 500 will remain in the closed state even though no further electrostatic or other energy is expended. Although FIGS. 5A-C have concentrated on actuation of terminal arms 506 and 508, similar concepts could be employed to actuate terminal arms 502, 504 and to place moveable member 101 in contact with arms 502, 504. Switch 500 is therefore capable of several stable output states, and may be considered to be a multi-stable switch.

Additional detail about an exemplary actuation scheme is shown in FIG. 6. With reference now to FIG. 6, each terminal arm 506, 508 is fabricated with an electrostatic-sensitive area 606 that is receptive to electrostatic energy provided by actuators 602, 604, respectively. Electrostatic energy from actuators 602, 604 appropriately attracts a metal, permalloy or other material in areas 606 to displace the arms away from their bias position. Although actuators 602, 604 and areas 606 are shown as comb-type actuators in FIG. 6, any time of electrostatic or other actuation could be used in alternate but equivalent embodiments. Similarly, moveable member 101 may be actuated into position using any actuation technique or structure 308. Although a simple block actuator 308 is shown in FIG. 6, in practice moveable member 101 may be displaced with a comb-type or other actuator such as that discussed in conjunction with FIG. 3 above.

In various embodiments, the relative positions of outcropping 510 and areas 606 may be designed so as to increase the amount of leverage applied by terminal arms 506 and/or 508 upon moveable member 101. In the embodiment shown in FIG. 6, arms 506 and 508 appropriately pivot about a relatively fixed base 512. If the actuation force is applied to the arms at a position on arms 506, 508 that is relatively far from the pivot point, the amount of displacement realized from the actuation force can be increased or maximized. Similarly, by locating outcropping 510 to be relatively nearer to pivot point 510, the amount of leverage applied by arms 506, 508 upon member 101 can be increased. This increase in leverage appropriately provides improved mechanical force to thereby maintain arms 506, 508 in position against member 101, and serves to increase the efficiency of force applied for a given duration or magnitude of actuating force. Of course other physical layouts of arms 506, 508 and member 101 could be formulated, with outcropping 510 and/or areas 606 being relocated, eliminated or combined in other equivalent embodiments. The efficiency of the actuating force can be further increased by providing a dielectric material in the spaces surrounding and/or in close proximity to actuators 602, 604 and/or areas 606. Examples of dielectric materials that may be present in various exemplary embodiments include ceramics, polymers (e.g. polyimides or epoxies), silicon dioxide ($SiO_2$), dielectric liquids and/or any other organic or inorganic dielectric material.

Accordingly, there is provided a micro electromagnetic switch that is capable of providing enhanced electrical connectivity, and that is capable of remaining in a selected output state even when actuation energy is no longer provided to the switch. Such switches have numerous applications across many fields, including medical, aerospace, consumer electronics, and the like.

While at least one exemplary embodiment has been presented in the foregoing detailed description, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing the exemplary embodiment or exemplary embodiments. It should be understood that various changes can be made in the function and arrangement of elements without departing from the scope of the invention as set forth in the appended claims and the legal equivalents thereof.

What is claimed is:

1. A micro electromechanical switch comprising:
   a base substrate portion formed from a substrate;
   a switch device, wherein the switch device comprises a moveable member separated at least in part from the base substrate portion so as to permit lateral movement of the moveable member along the base substrate portion, wherein the lateral movement allows the moveable member to electrically engage and disengage with a receiving terminal, and further wherein the moveable member and the receiving terminal each comprise:
      a switch substrate portion formed from the substrate;
      an insulating layer proximate to the switch substrate portion, wherein at least the insulating layer defines a corner region of the moveable member; and
      a conducting layer proximate to the insulating layer, wherein the insulating layer lies between the conducting layer and the switch substrate portion, and further wherein the conducting layer comprises a protruding region extending radially outward from the switch substrate portion and at least the corner region of the moveable member; and
   wherein the moveable member further comprises an actuating portion responsive to an actuation stimulus to cause the protruding region of the moveable member to laterally and switchably engage and disengage the protruding region of the receiving terminal to thereby toggle the micro electromechanical switch between an open state and a closed state.

2. The micro electromechanical switch of claim 1 wherein the conducting layer comprises a first conducting layer proximate to the insulating layer and a second conducting layer proximate to the first conducting layer opposite the insulating layer.

3. The micro electromechanical switch of claim 2 wherein the second conducting layer is formed on the first conducting layer, and wherein the second conducting layer comprises the protruding region.

4. The micro electromechanical switch of claim 3 wherein the second conducting layer comprises a noble metal.

5. The micro electromechanical switch of claim 4 wherein the noble metal is gold.

6. The micro electromechanical switch of claim 3 wherein the first conducting layer has a pattern corresponding to electrically conductive portions of the switch device.

7. The micro electromechanical switch of claim 6 wherein the pattern comprises a contact area in electrical communication with the electrically conductive portions of the switch.

8. The micro electromechanical switch of claim 1 wherein the substrate comprises a sacrificial layer.

9. The micro electromechanical switch of claim 8 wherein the switch substrate portion of the receiving terminal comprises a portion of the sacrificial layer and the switch substrate portion of the moveable member lacks any portion of the sacrificial layer.

10. The micro electromechanical switch of claim 1 wherein, when the moveable member is moved laterally and the protruding region of the moveable member extending from the corner region thereof is electrically engaged with the protruding region of the receiving terminal extending from the corner region thereof, separation exists between the switch substrate portion of the moveable member and the switch substrate portion of the receiving terminal to provide electrical isolation therebetween.

11. The micro electromechanical switch of claim 1 wherein the actuating portion of the moveable member responsive to an actuation stimulus comprises at least one end region, wherein the switch further comprises an actuator contact formed to receive the at least one end region of the movable member in response to an actuation stimulus being applied to the actuator contact to cause the protruding region of the moveable member to move laterally and switchably engage or disengage the protruding region of the receiving terminal to thereby toggle the micro electromechanical switch between an open state and a closed state.

12. A micro electromechanical switch comprising:
   a base substrate portion;
   a switch device, wherein the switch device comprises a moveable member separated at least in part from the base substrate portion so as to permit lateral movement of the moveable member along the base substrate portion, wherein the lateral movement allows the moveable member to electrically engage and disengage with a receiving terminal, wherein the receiving terminal comprises:
      a switch substrate portion;
      an insulating layer proximate to the switch substrate portion, wherein at least the insulating layer defines a corner region of the receiving terminal; and
      a conducting layer proximate to the insulating layer, wherein the insulating layer lies between the conducting layer and the switch substrate portion, and further wherein the conducting layer comprises a protruding region that extends outward from the switch substrate portion and at least the corner region of the receiving terminal;
   and further wherein the moveable member comprises:
      a conducting portion; and
      an actuating portion responsive to an actuation stimulus to cause the conducting portion of the moveable member to laterally and switchably engage and disengage the protruding region of the receiving terminal to thereby toggle the micro electromechanical switch between an open state and a closed state.

13. The switch of claim 12 wherein the conducting portion of the moveable member comprises a second protruding region configured to electrically mate with the protruding region of the receiving terminal.

14. A micro electromechanical switch comprising:
a base substrate portion;
a switch device, wherein the switch device comprises a moveable member separated at least in part from the base substrate portion so as to permit lateral movement of the moveable member along the base substrate portion, wherein the lateral movement allows the moveable member to electrically engage and disengage with a receiving terminal, wherein the receiving terminal comprises:
a switch substrate portion;
an insulating layer proximate to the switch substrate portion; and
a conducting portion;
and further wherein the moveable member comprises:
a switch substrate portion;
an insulating layer proximate to the switch substrate portion, wherein at least the insulating layer defines a corner region of the moveable member;
a conducting layer proximate to the insulating layer, wherein the insulating layer lies between the conducting layer and the switch substrate portion, wherein the conducting layer comprises a protruding region that extends outward from the switch substrate portion and at least the corner region of the moveable member; and
an actuating portion responsive to an actuation stimulus to cause the protruding region of the moveable member to laterally and switchably engage and disengage the conducting portion of the receiving terminal to thereby toggle the micro electromechanical switch between an open state and a closed state.

15. The switch of claim 14 wherein the conducting portion of the receiving terminal comprises a second protruding region configured to electrically mate with the protruding region of the moveable member.

* * * * *